US012800681B2

United States Patent
(12) United States Patent
Kavehei et al.

(10) Patent No.: US 12,800,681 B2
(45) Date of Patent: Nov. 17, 2026

(54) MAGNETIC FIELD SENSOR

(71) Applicant: Deteqt Pty Ltd, Darlington (AU)

(72) Inventors: Omid Kavehei, Sydney (AU); James Rabeau, Sydney (AU); Thomas Boele, Sydney (AU)

(73) Assignee: Deteqt Pty Ltd, Darlington (AU)

( * ) Notice: Subject to any disclaimer, the term of this patent is extended or adjusted under 35 U.S.C. 154(b) by 0 days.

(21) Appl. No.: 19/225,351

(22) Filed: Jun. 2, 2025

(65) Prior Publication Data

US 2026/0153572 A1 Jun. 4, 2026

Related U.S. Application Data

(63) Continuation of application No. PCT/AU2023/051208, filed on Nov. 24, 2023.

(51) Int. Cl.
*G01R 33/032* (2006.01)

(52) U.S. Cl.
CPC .................................. *G01R 33/032* (2013.01)

(58) Field of Classification Search
CPC ......................... G01R 33/032; G01R 33/0011; G01R 33/383; G01R 33/60; G01R 33/323; G01R 33/26; G01R 33/0094; G01N 24/006; A61B 2562/0223
See application file for complete search history.

(56) References Cited

U.S. PATENT DOCUMENTS

| | | | |
|---|---|---|---|
| 9,995,800 | B1 | 6/2018 | Schwindt et al. |
| 2019/0235031 | A1 | 8/2019 | Ibrahim et al. |
| 2022/0075013 | A1 | 3/2022 | Bogdanovic et al. |
| 2022/0146605 | A1 | 5/2022 | Frangeskou et al. |

(Continued)

FOREIGN PATENT DOCUMENTS

| | | | | |
|---|---|---|---|---|
| CN | 111679098 A | 9/2020 | | |
| WO | WO-2016118791 A1 * | 7/2016 | ........... | G01R 33/032 |
| WO | 2018174905 A1 | 9/2018 | | |

OTHER PUBLICATIONS

Chrostoski et al., Electric Noise Spectra of a Near-Surface Nitrogen-Vacancy Center in Diamond with a Protective Layer, Phys. Rev Applied 10, 064056, 2018 (Year: 2018).*

(Continued)

*Primary Examiner* — Daniel R Miller
(74) *Attorney, Agent, or Firm* — Jeffrey Schox; Randy Mehlenbacher

(57) ABSTRACT

A differential detection system (1) has a light trapping diamond nitrogen vacancy doped layer (2) with an adjacent microwave resonator (4) having a resonance frequency with an operating bandwidth about the magnetic resonance of the nitrogen vacancy centre. The resonator (4) includes a suppressed portion (4B) and an unsuppressed portion (4A). A sensor photodiode (6A) is disposed distal the doped layer (2) and aligned with the unsuppressed portion (4A) of the microwave resonator (4), and a reference photodiode (6B) is spaced apart from and substantially in the same plane as the sensor photodiode (6A) and being aligned with the unsuppressed portion (4A) of the microwave resonator (4). The sensor (6A) and reference (6B) photodiodes are connected back-to-back to a single transimpedance amplifier.

17 Claims, 4 Drawing Sheets

(56) References Cited

U.S. PATENT DOCUMENTS

2024/0142396 A1* 5/2024 Fuchs .................. G01R 33/381

OTHER PUBLICATIONS

M. I. Ibrahim, C. Foy, D. R. Englund and R. Han, "High-Scalability CMOS Quantum Magnetometer With Spin-State Excitation and Detection of Diamond Color Centers," in IEEE Journal of Solid-State Circuits, vol. 56, No. 3, pp. 1001-1014, Mar. 2021 (Year: 2021).*

Barry, J.F., et al., "Sensitivity Optimization for NV-diamond Magnetometry", Reviews of Modern Physics, vol. 92, Jan.-Mar. 2020, vol. 92, Iss. 1: 015004 (whole document).

* cited by examiner

MAGNETIC FIELD SENSOR

CROSS-REFERENCE TO RELATED APPLICATIONS

This Application is a Continuation of PCT Application No. PCT/AU2023/051208, filed on Nov. 24, 2023, which claims priority to Australian Provisional Patent Application No. 2022903685, filed on Dec. 2, 2022, the entireties of which are incorporated herein by reference.

FIELD OF THE INVENTION

The present invention relates to magnetic field sensing and, in particular, to a magnetometer for measuring magnetic fields.

The invention has been developed to provide a magnetometer apparatus and readout substantially disposed on a single chip and will be described with reference to this application that can be used as an accelerometer. However, it will be appreciated that the invention is not limited to this particular application and widely applicable to detecting small changes in surrounding physical conditions including magnetic fields and temperature, for example.

BACKGROUND OF THE INVENTION

For several years, the world has been on the cusp of a breakthrough into new quantum technologies becoming available for real-world applications. While the advantages of a "quantum" approach are unparalleled, most remain impractical because of the size, weight, and power requirements, and of predominantly large and expensive laboratory-based systems. Addressing this is not trivial, especially when many quantum-enabled technologies require cryogenic cooling to operate.

Existing classical magnetometers have limitations (for example thermal noise, drift, large size/weight and high-power consumption) that preclude any possibility for navigation using Earth's magnetic field lines. Quantum-based sensors show promise, but while their sensitivities can be in the fT/√Hz vicinity, most are limited, for example, because they can not yield some directional information (atomic vapour cells), they require large peripheral instrumentation for cooling (Superconducting quantum interference devices). They are expensive to build and run. Each technique has strengths and weaknesses, and there is rarely a one-size-fits-all solution. A technique using the magnetic sensitivity of nitrogen-vacancy centres in diamond point to promising new quantum platforms to enable GPS-free navigation capability for both civilian and military applications.

The approach is based on the optical detection of magnetic resonance signatures from the negatively charged nitrogen-vacancy (NV) centre in diamond. The NV centre is a nitrogen atom replacing a carbon atom in the diamond lattice and adjacent to a "vacant" site. This gives rise to a robust fluorescence signal when the NV is illuminated by a laser having a wavelength below some threshold which is found usually between about 510 nm and 540 nm. The optical fluorescence changes measurably depending on the surrounding magnetic or microwave fields as a result at least in part on the phenomenon known as a Zeeman shift or effect. This gives rise to a great number of possible real-world applications, in particular quantum technologies.

An attempted apparatus is known from US Pat. Publ. No 2019/0235031. Here, an on-chip sensor comprises a RF or microwave generator with an optical filter disposed centrally. An $NV^-$ vacancy doped diamond is disposed closed adjacent the microwave generator and receives laser light input incident thereon. Disposed below is a photodetector with a plasmonic filter intermediate for removing incident light, where the photodetector provides an electrical output of the signal. The incident laser light is split to provide a reference signal to a reference diode. The signal from the on-chip photodiode and from the reference photodiode are sent to respective transimpedance amplifiers (TIAs).

In this prior art, the on-chip diode array (sensing) total photocurrent is sensed by an off-chip TIA and using an off-chip reference diode. This produces disparities between the two sensing and reference currents due to the type (exact material stack), exact dimensions and parasitic elements on the path of the sensing current to its off-chip TIA. This is thought to be a crucial barrier toward full integration of a diamond quantum sensing system on a single chip as the prior art lacks the ability to sense extremely low magnitude fluorescence currents.

OBJECT OF THE INVENTION

The object of the invention is a desire to provide a magnetometer that overcomes one or more of the disadvantages of the prior art, or to provide a useful alternative.

SUMMARY OF THE INVENTION

According to a first aspect of the invention there is provided a sensor comprising:

- a light trapping diamond nitrogen vacancy doped layer having upper and lower faces;
- a dielectric coating disposed over a portion of the lower face of the diamond layer;
- a microwave resonator disposed adjacent the dielectric coating and having a resonance frequency with an operating bandwidth about the magnetic resonance of the nitrogen vacancy centre, the resonator having a suppressed portion and an unsuppressed portion wherein the field generated by the unsuppressed portion is greater than the field of the suppressed portion;
- an optical filter disposed adjacent the microwave generator;
- at least one sensor photodiode array disposed adjacent the optical filter and aligned with the unsuppressed portion of the microwave resonator; and
- at least one reference photodiode array spaced apart from and substantially in the same plane as the sensor photodiode, the reference photodiode being aligned with the suppressed portion of the microwave resonator.

According to a second aspect of the invention a method of providing a magnetic field sensor, the method comprising the steps of:

- providing a light trapping diamond nitrogen vacancy doped layer having an upper and a lower face and applying a dielectric coating disposed over a portion of the diamond layer lower face;
- disposing a microwave resonator adjacent the dielectric coating;
- providing the resonator with a suppressed portion and an unsuppressed portion;
- disposing an optical filter disposed adjacent the microwave generator;
- disposing at least one sensor photodiode array adjacent the optical filter and aligned with the unsuppressed portion of the microwave resonator; and disposing at least one reference photodiode array spaced apart from and substantially in the same plane as the sensor photodiode, and aligning the reference photodiode with the suppressed portion of the microwave resonator.

According to another aspect differential detection system comprising:

a light trapping diamond nitrogen vacancy doped layer with an adjacent microwave resonator having a resonance frequency with an operating bandwidth about the magnetic resonance of the nitrogen vacancy centre, the resonator having a suppressed portion and an unsuppressed portion wherein the field generated by the unsuppressed portion is greater than the field of the suppressed portion;

a sensor photodiode disposed distal the doped layer and aligned with the unsuppressed portion of the microwave resonator, and a reference photodiode spaced apart from and substantially in the same plane as the sensor photodiode, the reference photodiode being aligned with the unsuppressed portion of the microwave resonator, wherein the sensor and reference photodiodes are connected back-to-back to a single transimpedance amplifier.

It can therefore be seen there is advantageously provided a sensor with both the sensing and reference photodiodes on the same chip and excitation laser light can be filtered together with any other non-ideal currents. This allows the microwave generation and front-end of the device readout importantly with a single on-chip TIA that provides a sufficiently strong signal.

BRIEF DESCRIPTION OF THE DRAWINGS

A preferred embodiment of the invention will now be described, by way of example only, with reference to the accompanying drawings in which.

DETAILED DESCRIPTION

Figure 1:
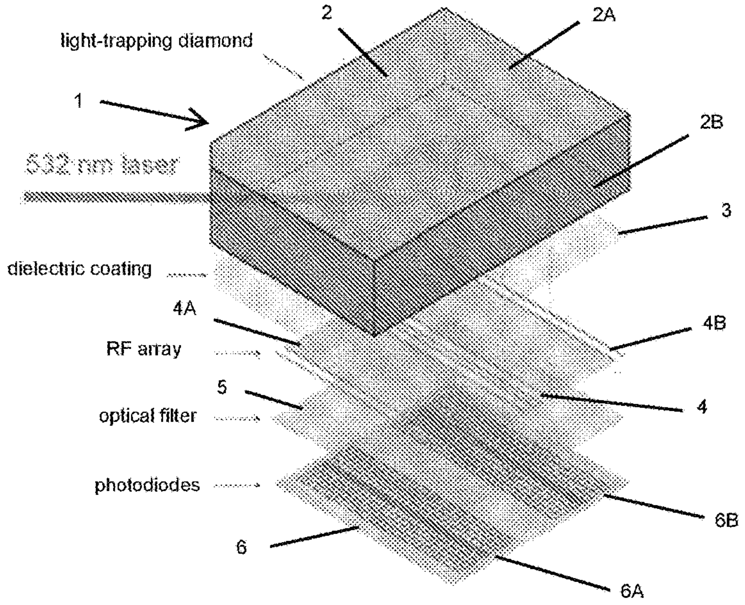
FIG. 1 is an exploded perspective view of the magnetic field sensor according to the preferred embodiment.
Figure 2:
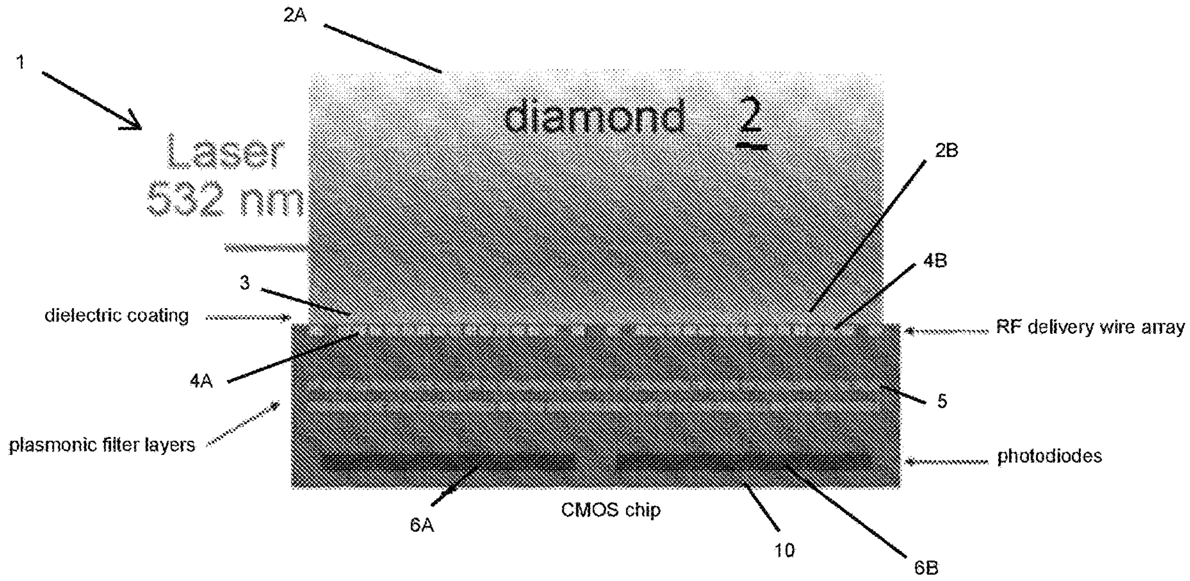
FIG. 2 is a schematic cut-away side view of the sensor of FIG. 1.
Figure 3:
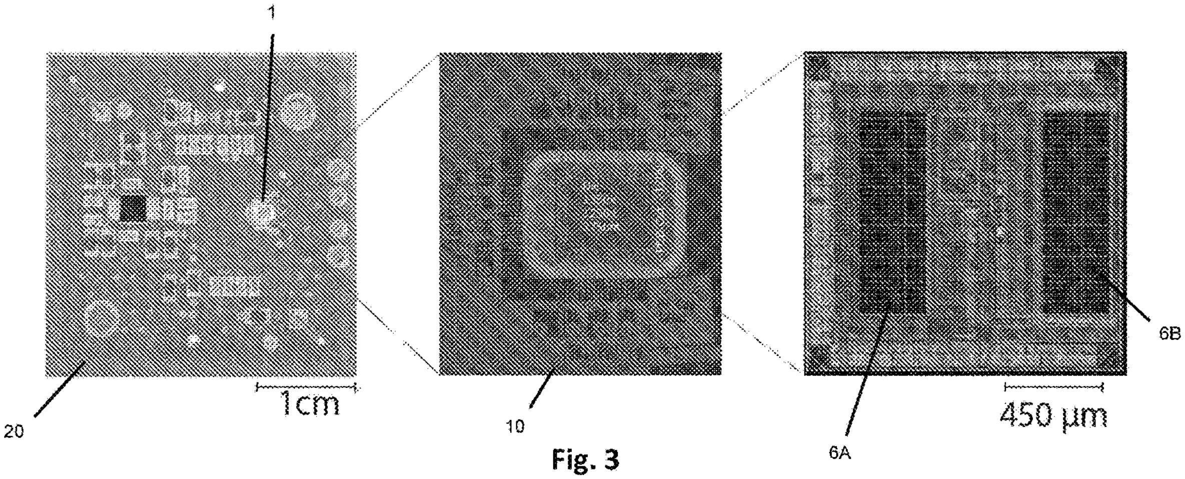
FIG. 3 is a representation of the sensor of FIG. 1 disposed on an integrated circuit.

Referring to the drawings generally, it will be appreciated that like reference numerals are used to denote like components unless expressly denoted otherwise. In FIG. 1 there is shown an exploded elevated perspective view of a magnetic field sensor according to the preferred embodiment. FIG. 2 shows a cut-away side view of the sensor 1 of FIG. 1 integrated into a CMOS semiconductor chip 10. FIG. 3 shows sensor 1 on chip 10 mounted to a semiconductor circuit board 20.

The magnetic field sensor 1 includes a light trapping diamond nitrogen vacancy doped layer 2 having an upper 2A and lower 2B face. A dielectric coating 3 is disposed over a portion of the lower face 2B of the diamond layer 2.

A microwave resonator (or RF array) 4 is located under the dielectric coating 3 distal doped layer 2. The resonator 4 is configured to excited nitrogen vacancy centres in the doped layer 2. As best shown in FIG. 1, the resonator 4 includes a suppressed portion 4B and an unsuppressed portion 4A. The field adjacent the unsuppressed portion 4A is much larger than adjacent the suppressed portion 4B, preferably by at least two orders of magnitude or more.

An optical filter 5 in the form of a plasmonic filter is disposed adjacent the microwave generator 4 distal doped layer 2. The filter 5 is adapted to prevent transmission of scattered non-fluorescent light as described below. Under the filter 5 distal resonator 4 is located a photodiode array 6 formed from a plurality of substantially equi-spaced array.

The photodiode array 6 is formed from two portions, sensor portion 6A & reference portion 6B, and these portions preferably share substantially the same physical characteristics. In some preferred embodiments, photodiode array portions 6A & 6B are integrally formed in a unitary photodiode array 6. Advantageously, this allows signals to either portion 6A or 6B to provide substantially the same response and have substantially the same noise.

The reference photodiode array 6B is disposed adjacent the optical filter 5 and aligned with the suppressed portion 4B of the microwave resonator 4. The sensor photodiode array 6A is preferably on the same 'chip' as portion 6B and is in the same plane. The sensor photodiode 6A is aligned with the unsuppressed portion 4A of the microwave resonator 4. Here, it will be appreciated that the ODMR effect is suppressed above RF array where the RF field is suppressed. This provides a reference of the background fluorescence and scattered green light from the laser pump 2. As such, this provides a distinction between the RF field above the resonator and the microwave resonator itself because while the RF field is suppressed/unsuppressed, that is an active effect of currents flowing through the wires in what we are described as the "suppressed" part of the resonator.

Referring particularly to FIGS. 2 & 3, the sensor 1 is mounted to a CMOS semiconductor chip 10 which in turn is shown in the preferred embodiment mounted to a semiconductor circuit board 20. Here, photodiode array 6 (and hence sensor 4A and reference 4B photodiodes) is integrated with the CMOS chip 10 which is mounted to circuit board 20. Electrical outputs (best seen in FIG. 3) of the photodiode arrays 6A & 6B are connected to circuitry on the circuit board 20 via the mounted CMOS chip 10.

Although not clearly shown in FIG. 3, the electrical output of sensor photodiode 6A and reference photodiode 6B are connected back-to-back to a single transimpedance amplifier disposed on the circuit board 20. This arrangement advantageously addresses the disadvantage of having the disparate sensor and reference diodes connected to an off-chip transimpedance amplifier.

Further, in the preferred embodiment circuit board 20 further includes a microwave or RF generator configured to provide a signal to the microwave resonator 4, as well as accommodating a phase locked loop in communication with the microwave resonator 4 and the output of the photodiode detector transimpedance amplifiers. Ideally, the circuit board 20 (although not clearly shown in FIG. 3) also accommodates processing circuitry configured to process signals from the sensor photodiode detector in response to fluorescence, as described below.

In use, it will be appreciated that the sensor 1 of the preferred embodiment most advantageously removes background (preferably green) excitation light and any other non-ideal current. This is because these appear almost identically on both photodiode arrays 6A & 6B as they are on the same CMOS chip 10 are in essence located in a proximity of hundredths of micrometres to one another.

It will be appreciated that in the preferred embodiment, the entire microwave generation and front-end readout systems can be integrated on a 1.2×1.2 $mm^2$ CMOS chip 10, which is integrated on a board 20 being roughly equivalent in area to the size of an Australian 50 cent coin. Sensor 1 overcomes the crucial step of integrating TIAs into the chip to produce an amplified and strong signal at the output of the TIA that is sufficiently to be fed into a digitisation and lock-in amplifier stage (e.g. on an FPGA). As shown, the whole sensor 1 apparatus can be integrated on a 3×3 $mm^2$ chip, leaving only the excitation laser and doped diamond layer 2 as off-chip components.

Figure 4:
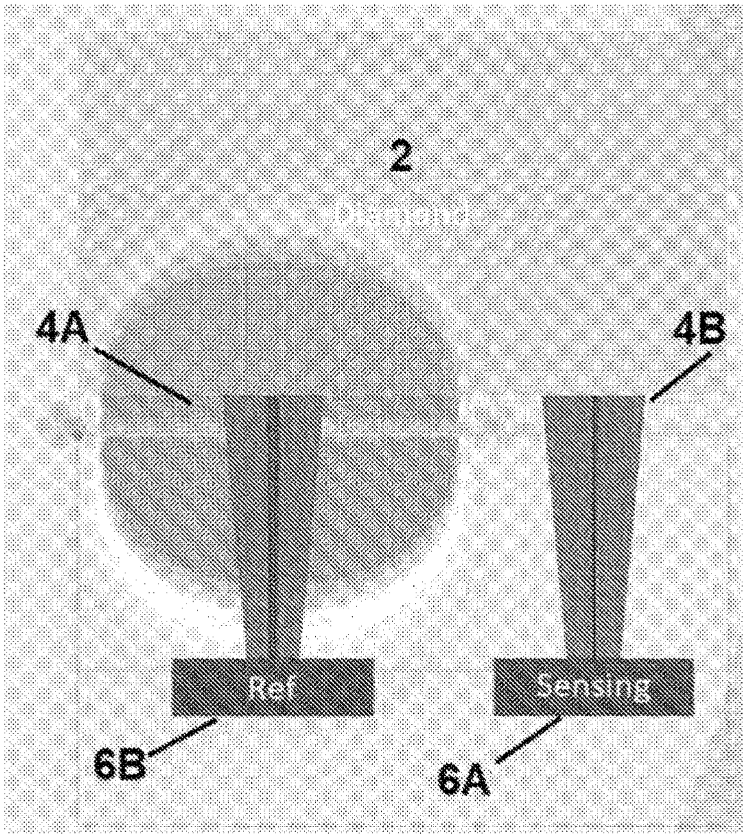
FIG. 4 is a schematic representation of sensor and reference photodiode array input signals for the sensor if FIG. 1.

Referring now to FIG. 4, there is shown a schematic representation of the light input to photodiodes 6A & 6B. As noted above, sensor 1 provides for full integration of the entire key readout system-on-chip using two diode arrays (sensing 6A and reference 6B) and engineered suppression of red fluorescence contrast over the sensing diode 6A. Red light is schematically shown in the central portion of the beam illuminating photodiode arrays 6A & 6B and green light surrounding that. It will be appreciated that FIG. 4 is intended to qualitatively show the balanced detection scheme operating with ODMR induced fluorescence contrast occurring above the sensing photodiode. This is illustrated as a deliberately exaggerated representation of the balanced detection scheme to show how it detects a relatively very small effect as the ODMR contrast is usually less than a 1% decrease in the red fluorescence signal.

The sensor 1 of the preferred embodiment produces a magnetic field on the sensing photodiode array 6A, which results in the suppression of the red fluorescent signature. This results in $C^{*}I_R+I_G+I_d+I_n=I_{SD}$ incident on the sensing array 6A, where $I_{SD}$ indicates the total photocurrent produced by the sensing diode array 6A, $I_R$ is the current produced by the red fluorescence, C is the fractional fluorescence contrast, $I_G$ is the current produced by background green excitation light used to excite the NV centres in the doped layer. $I_d$ and $I_n$ show dark and noise currents, respectively. It is noted that suppression in this context relates to the ODMR contrast (or red fluorescence suppression) which occurs over the unsuppressed RF antenna 4A while there is no ODMR contrast (red fluorescence is unsuppressed) over the suppressed RF antenna 4B.

It can reasonably be assumed that both photodiodes 6A & 6B are uniformly exposed to green background (from the excitation laser) and the noise currents in both diodes are very similar especially for any thermal noise. In this case, the photocurrent produced by the reference photodiode array 6B ($I_{RD}$) can be written as $I_R+I_G+I_d+I_n=I_{RD}$ which means the differential current input into the trans-impedance amplifier can be a good representation of the fluorescence (red) $I_{SD}-I_{RD}=I_{TIA}\propto I_R(C-1)$.

Figure 5:
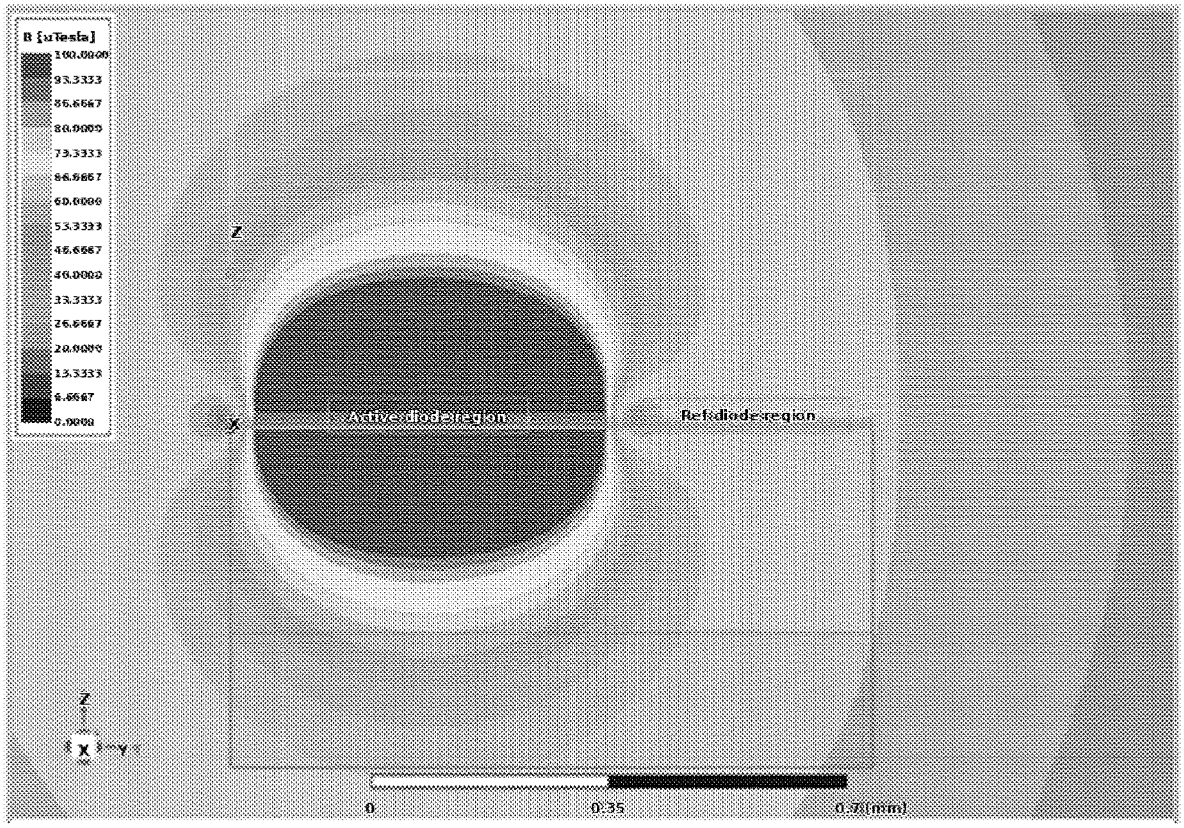
FIG. 5 is measured of the magnetic field from the resonator over the unsuppressed sensor and suppressed reference photodiode array signals.

Turning now to FIG. 5, this shows the simulated applied magnetic field amplitude from the resonator 4 over the unsuppressed sensor photodiode 6A and suppressed reference photodiode array 6B signals. It will be understood that the term "applied" magnetic field is an applied field being a temporary field involved in the measurement technique used in the preferred embodiments described. This is to be contrasted with an "external" magnetic field which is typically understood to be usually static or slowly varying and is the field that magnetometer 1 measures. Furthermore, "amplitude" is used as an RF field, so that in the preferred embodiments it is oscillating at around 2.87 GHz, as seen in FIG. 5 showing the amplitude of that oscillation.

Figure 6:
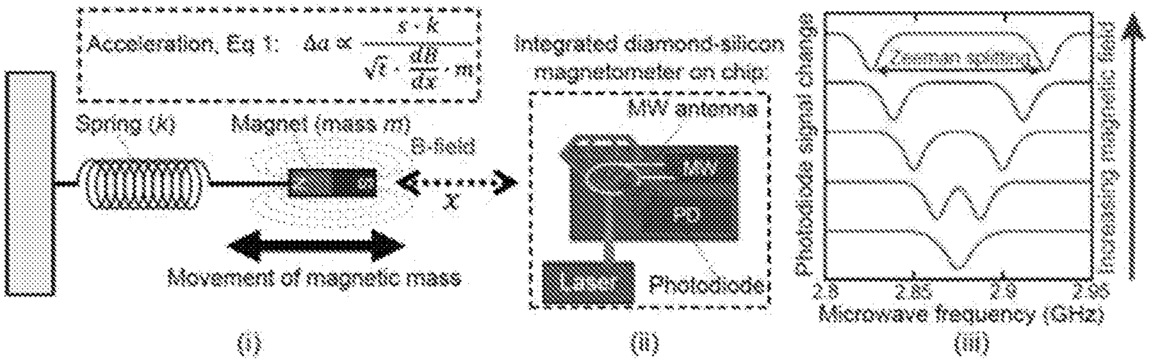
FIG. 6 shows an apparatus for testing characteristics of the sensor of FIG. 1 as an accelerometer.

FIGS. 6(*i*) to 6(*ii*) illustrate use of magnetic field sensor 1 as the basis from an accelerometer. In incorporating the sensor 1 into an accelerometer, a miniaturised quantum accelerometer with a hybrid silicon-diamond control and readout chip is provided based on the above. While the use of sensor 1 is applicable to other quantum technology architectures and applications, the quantum accelerometer shown in FIG. 6 for inertial measurement navigation or guidance and using sensor 1 allows for a diamond-based quantum magnetometer, including increased sensitivity and also miniaturisation and that most advantageously operates a room temperature.

In the embodiment of FIG. 6 where diamond-based quantum magnetometer 1 is combined with a classical mass-spring system to reach a high sensitivity and low drift means of measurements of acceleration. It is believed that 0.1 μg sensitivity can be achieved for an accelerometer based on sensor 1, which is understood to be an order-of-magnitude improvement over the state-of-the-art commercial devices. Such application of sensor 1 used as an accelerometer has a plurality of applications where high-accuracy and small-size navigation units are required such as unmanned aerial vehicles (UAVs), self-driving cars, space-craft, or subterranean and subsea navigation/mapping in the defence and mining industries.

FIG. 6 shows a simplified block diagram describing the sensor 1 used with the accelerometer. The mass spring system (i) induces a change of magnetic field at the diamond sensor 1 (ii) which causes an optically detectable Zeeman shift in the magnetic resonance (iii). A measurement of acceleration (α) can thus be made using:

$$\Delta a \propto \frac{s \cdot k}{\sqrt{t} \cdot \frac{dB}{dx} \cdot m}. \quad \text{(Eq 1)}$$

In this simplified representation, α is acceleration, s is magnetic field sensitivity in T/√Hz, dB/dx is the change in field felt by the sensor as the distance (x) between the sensor and the magnet of mass (m) changes and t is the measurement time.

The foregoing describes only one embodiment of the present invention and modifications, obvious to those skilled in the art, can be made thereto without departing from the scope of the present invention.

The term "comprising" (and its grammatical variations) as used herein is used in the inclusive sense of "including" or "having" and not in the exclusive sense of "consisting only of".

The invention claimed is:

1. A sensor comprising:

a light trapping diamond nitrogen vacancy doped layer having upper and lower faces;

a dielectric coating disposed over a portion of the lower face;

a microwave resonator disposed adjacent the dielectric coating and having a resonance frequency with an operating bandwidth about the magnetic resonance of the nitrogen vacancy centre, the resonator having a suppressed portion and an unsuppressed portion wherein a field generated by the unsuppressed portion is greater than a field generated by the suppressed portion;

an optical filter disposed adjacent the microwave resonator;

at least one sensor photodiode array disposed adjacent the optical filter and aligned with the unsuppressed portion of the microwave resonator; and at least one reference photodiode array spaced apart from and substantially in a same plane as the at least one sensor photodiode array, the at least one reference photodiode array being aligned with the suppressed portion of the microwave resonator.

2. A sensor according to claim 1 wherein the field generated by the unsuppressed portion of the microwave resonator is at least one or two orders of magnitude larger than the field generated by the suppressed portion of the microwave resonator.

3. A sensor according to claim 1 wherein the optical filter is a plasmonic filter.

4. A sensor according to claim 1 wherein the at least one sensor photodiode array and at least one reference photodiode array are integrally formed, or are formed from photodiodes having substantially identical or different physical characteristics.

5. A sensor according to claim 1 wherein the at least one sensor photodiode array and at least one reference photodiode array are mounted to a semiconductor integrated circuit or CMOS chip and each have outputs connected to at least one transimpedance amplifier in a plurality of transimpedance amplifiers disposed on the semiconductor integrated circuit or CMOS chip which includes electrical outputs for the transimpedance amplifiers.

6. A sensor according to claim 5 wherein the semiconductor integrated circuit or CMOS chip includes a microwave generator configured to provide a signal to the microwave resonator.

7. A sensor according to claim 5 wherein the semiconductor integrated circuit or CMOS chip includes a phase-locked loop in communication with the microwave resonator and the output of the transimpedance amplifiers.

8. An apparatus including the sensor according to claim 1 and further including processing circuitry configured to process signals from the at least one sensor photodiode array in response to a fluorescence.

9. A sensor according to claim 1 wherein the at least one sensor photodiode array and the at least one reference photodiode array are mounted to a semiconductor integrated circuit or CMOS chip and each have outputs connected to a transimpedance amplifier disposed on the semiconductor integrated circuit or CMOS chip which includes electrical outputs for the transimpedance amplifier.

10. A sensor according to claim 9 wherein the semiconductor integrated circuit or CMOS chip includes a microwave generator configured to provide a signal to the microwave resonator.

11. A sensor according to claim 9 wherein the semiconductor integrated circuit or CMOS chip includes a phase-locked loop in communication with the microwave resonator and the output of the transimpedance amplifier.

12. A sensor according to claim 1 wherein the at least one sensor photodiode array and the at least one reference photodiode array are mounted to a semiconductor integrated circuit or CMOS chip and each have outputs connected to each transimpedance amplifier in a plurality of transimpedance amplifiers disposed on the semiconductor integrated circuit or CMOS chip which includes electrical outputs for the transimpedance amplifiers.

13. A sensor according to claim 12 wherein the semiconductor integrated circuit or CMOS chip includes a microwave generator configured to provide a signal to the microwave resonator.

14. A sensor according to claim 12 wherein the semiconductor integrated circuit or CMOS chip includes a phase-locked loop in communication with the microwave resonator and the outputs of the transimpedance amplifiers.

15. A method of providing a magnetic field sensor, the method comprising the steps of:

providing a light trapping diamond nitrogen vacancy doped layer having an upper and a lower face and applying a dielectric coating over a portion of lower face;

disposing a microwave resonator adjacent the dielectric coating;

providing the resonator with a suppressed portion and an unsuppressed portion;

disposing an optical filter adjacent the microwave generator;

disposing at least one sensor photodiode array adjacent the optical filter and aligned with the unsuppressed portion of the microwave resonator; and disposing at least one reference photodiode array spaced apart from and substantially in the same plane as the at least one sensor photodiode array, and aligning the at least one reference photodiode array with the suppressed portion of the microwave resonator.

16. A method according to claim 15 wherein at least one sensor photodiode array and the at least one reference photodiode array are configured to produce a differential readout corresponding to a measured change in a optical response of NV vacancy diamond fluorescence.

17. A differential detection system comprising:

a light trapping diamond nitrogen vacancy doped layer with an adjacent microwave resonator having a resonance frequency with an operating bandwidth about the magnetic resonance of the nitrogen vacancy centre, the resonator having a suppressed portion and an unsuppressed portion wherein a field generated by the unsuppressed portion is greater than a field generated by the suppressed portion;

a sensor photodiode disposed distal the doped layer and aligned with the unsuppressed portion of the microwave resonator, and a reference photodiode spaced apart from and substantially in a same plane as the sensor photodiode, the reference photodiode being aligned with the unsuppressed portion of the microwave resonator, wherein the sensor and reference photodiodes are connected back-to-back to a single transimpedance amplifier.

* * * * *